(12) United States Patent
Marsh

(10) Patent No.: US 7,993,539 B2
(45) Date of Patent: *Aug. 9, 2011

(54) METHODS OF ETCHING NANODOTS, METHODS OF REMOVING NANODOTS FROM SUBSTRATES, METHODS OF FABRICATING INTEGRATED CIRCUIT DEVICES, METHODS OF ETCHING A LAYER COMPRISING A LATE TRANSITION METAL, AND METHODS OF REMOVING A LAYER COMPRISING A LATE TRANSITION METAL FROM A SUBSTRATE

(75) Inventor: Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/914,814

(22) Filed: Oct. 28, 2010

(65) Prior Publication Data

US 2011/0039406 A1   Feb. 17, 2011

Related U.S. Application Data

(63) Continuation of application No. 11/773,580, filed on Jul. 5, 2007, now Pat. No. 7,837,889.

(51) Int. Cl.
*B44C 1/22* (2006.01)
*C03C 15/00* (2006.01)
*C03C 25/68* (2006.01)
*C23F 1/00* (2006.01)

(52) U.S. Cl. .......................................... 216/57; 438/704

(58) Field of Classification Search .................. 438/704, 438/689, 591; 216/57, 87
See application file for complete search history.

(56) References Cited

U.S. PATENT DOCUMENTS

| | | |
|---|---|---|
| 5,976,394 A | 11/1999 | Chung |
| 6,846,424 B2 | 1/2005 | Baum et al. |
| 7,199,005 B2 | 4/2007 | Sandhu et al. |
| 7,202,127 B2 | 4/2007 | Busch et al. |
| 7,268,034 B2 | 9/2007 | Basceri et al. |
| 7,320,911 B2 | 1/2008 | Basceri et al. |
| 7,393,741 B2 | 7/2008 | Sandhu et al. |
| 7,393,743 B2 | 7/2008 | Manning |
| 7,413,952 B2 | 8/2008 | Busch et al. |
| 7,439,152 B2 | 10/2008 | Manning |
| 7,445,990 B2 | 11/2008 | Busch et al. |
| 7,445,991 B2 | 11/2008 | Manning |
| 7,473,637 B2 | 1/2009 | Kraus et al. |
| 7,517,753 B2 | 4/2009 | Manning |
| 7,534,694 B2 | 5/2009 | Manning |
| 7,544,563 B2 | 6/2009 | Manning |
| 7,557,013 B2 | 7/2009 | Bhat et al. |
| 7,557,015 B2 | 7/2009 | Sandhu et al. |
| 7,575,978 B2 | 8/2009 | Kraus et al. |
| 2005/0090113 A1 | 4/2005 | Chang |
| 2008/0248653 A1 | 10/2008 | Marsh |

*Primary Examiner* — Roberts Culbert
(74) *Attorney, Agent, or Firm* — Wells St. John P.S.

(57) ABSTRACT

Embodiments of the invention include methods of etching nanodots, to methods of removing nanodots from substrates, and to methods of fabricating integrated circuit devices. In one embodiment, a method of etching nanodots that include a late transition metal includes exposing such nanodots to a gas comprising a phosphorus and halogen-containing compound and an oxidizing agent. After the exposing, the nanodots which are remaining and were exposed are etched (either partially or completely) with an aqueous solution comprising HF.

19 Claims, 5 Drawing Sheets

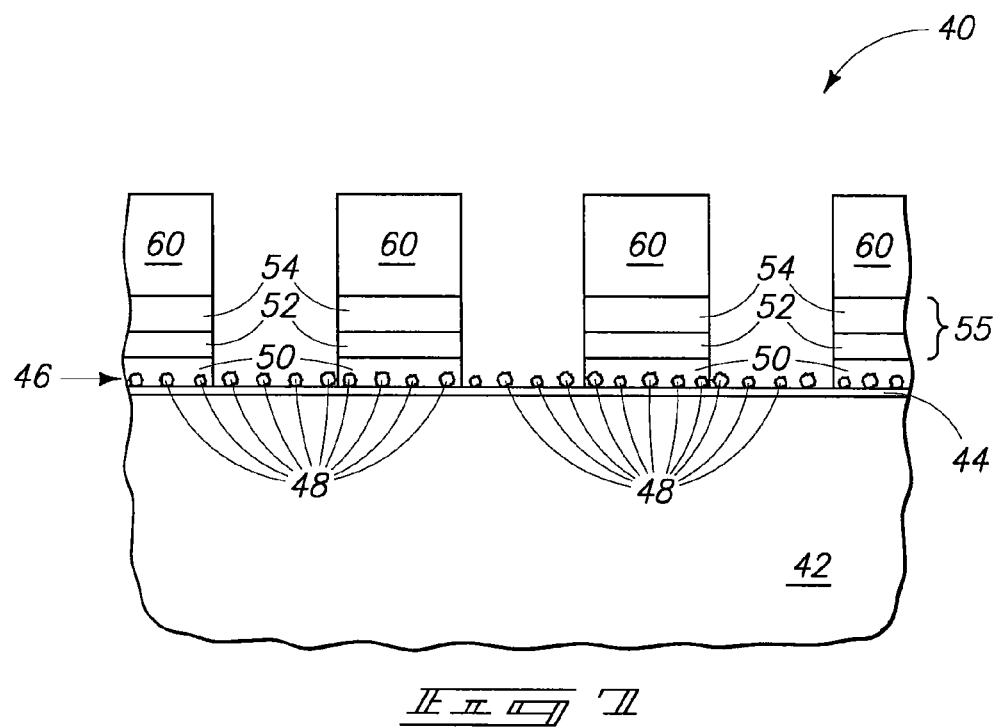
_Fig. 7_
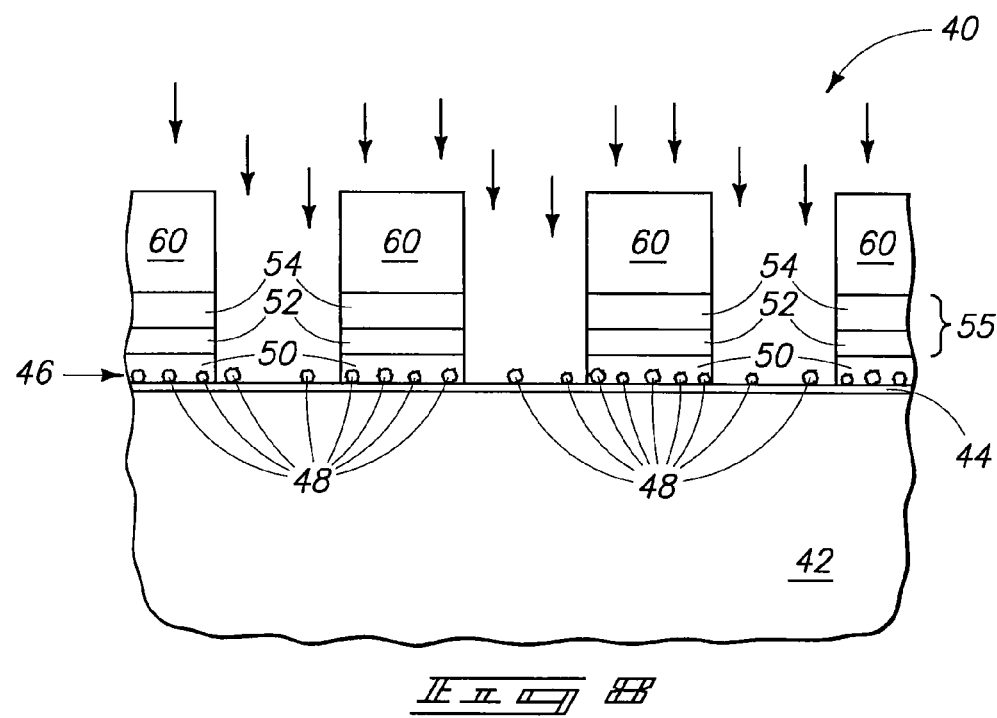
_Fig. 8_

METHODS OF ETCHING NANODOTS, METHODS OF REMOVING NANODOTS FROM SUBSTRATES, METHODS OF FABRICATING INTEGRATED CIRCUIT DEVICES, METHODS OF ETCHING A LAYER COMPRISING A LATE TRANSITION METAL, AND METHODS OF REMOVING A LAYER COMPRISING A LATE TRANSITION METAL FROM A SUBSTRATE

This patent resulted from a continuation application of U.S. patent application Ser. No. 11/773,580, filed Jul. 5, 2007, entitled "Methods of Etching Nanodots, Methods of Removing Nanodots From Substrates, Methods of Fabricating Integrated Circuit Devices, Methods of Etching a Layer Comprising a Late Transition Metal, and Methods of Removing a Layer Comprising a Late Transition Metal From a Substrate", naming Eugene P. Marsh as inventor, the disclosure of which is incorporated by reference.

TECHNICAL FIELD

Embodiments of the invention relate to methods of etching nanodots, to methods of removing nanodots from substrates, to methods of fabricating integrated circuit devices, to method of etching a layer comprising a late transition metal, and to methods of removing a layer comprising a late transition metal from a substrate.

BACKGROUND OF THE INVENTION

Transition metals are of increasing importance in a variety of electronic and electrochemical applications. This is because transition metals are excellent electrical conductors, are generally unreactive, and resist oxidation. In addition, late transition metals form stable interfaces with high dielectric constant materials and form good electrical contacts with other metals used for interconnection. Thus, the late transition metals have suitable properties for a variety of uses in the formation of integrated circuitry. They are, for example, suitable for use as electrodes in high-k and ferroelectric capacitors, and in metallization stacks and barriers between dielectric material and semiconductive material, such as silicon of semiconductor substrates in semiconductor integrated circuit devices.

One example integrated circuit semiconductor device is a field effect transistor having a gate construction which includes a conductive control gate region and a floating gate or charge trapping region. The floating gate or charge trapping region is received intermediate the control gate and a channel region, and is separated from each by non-conductive dielectric material. As device geometry continues to shrink, the dielectric material separating these regions become thinner. Such may undesirably result in leakage current flowing between the floating gate or charge trapping region through the dielectric material into the channel region, and thereby adversely effect operation of the device.

Late transition metals have been proposed for use as material in such gate stacks for either of the control gate or for the floating gate or charge trapping region. The gate constructions or stacks might be formed by patterning a mask into desired line shapes, and subsequently substantially anisotropically etching exposed unmasked regions of the gate stack materials to form the desired gate lines. Such, of course, requires etching of unmasked late transition metal material of such gate stack materials. However, late transition metals can be difficult to uniformly and selectively etch relative to other materials. Late transition metals, such as platinum, rhodium, iridium, palladium, copper cobalt, iron, nickel, silver, osmium, gold, and ruthenium, can be wet etched or ion milled. Halogen-containing gases, such as chlorine gas or hydrogen bromide, and oxygen have also been used to plasma etch platinum. Since the late transition metals are relatively unreactive, highly reactive etchants are often used. However, if during fabrication the integrated circuit includes other exposed materials such as main group metals, early transition metals, hard mask materials and/or photoresist materials, these highly reactive etchants can remove the other exposed materials at a faster rate than the late transition metal or damage the other exposed materials. Alternatively, high temperature etching is used to increase the etch rate of the unreactive late transition metal. However, other exposed materials, such as hard mask materials, photoresist, main group metals, early transition metals, are not usually compatible with high temperature, corrosive etches.

While the invention was motivated in addressing the above identified issues, it is in no way so limited. The invention is only limited by the accompanying claims as literally worded, without interpretative or other limiting reference to the specification, and in accordance with the doctrine of equivalents.

BRIEF DESCRIPTION OF THE DRAWINGS

Example embodiments of the invention are described below with reference to the following accompanying drawings.

FIG. 7 is a view of the FIG. 5 substrate subsequent to that shown by FIG. 6.

FIG. 8 is a view of the FIG. 5 substrate subsequent to that shown by FIG. 7.

DETAILED DESCRIPTION OF SOME EMBODIMENTS

This disclosure of the invention is submitted in furtherance of the constitutional purposes of the U.S. Patent Laws "to promote the progress of science and useful arts" (Article 1, Section 8).

Embodiments of the invention disclosed herein encompass methods of etching nanodots comprising a late transition metal. As used herein, nanodots are structures less than or equal to about 1,000 nanometers along a maximal cross-section. The nanodots may, for example, have maximal cross-sectional dimensions of from about 10 nanometers to about 100 nanometers. Regardless, such might contact one another laterally or stack atop one another, and may form a layer of nanodots which is largely continuous over a substrate, or more often discontinuous comprising spaced nanodots and/or spaced islands of clumped or grouped nanodots. As used herein, "late transition metal" may include, but is not limited to, platinum, rhodium, iridium, palladium, copper, cobalt, iron, nickel, ruthenium, silver, osmium, gold, allows thereof and combinations thereof. Accordingly, the nanodots referred to herein may include one or more of the just-stated elemental metals. Further and regardless, a layer comprising nanodots might also be considered to or comprise material intervening between spaced nanodots or spaced nanodots islands.

Figure 1:
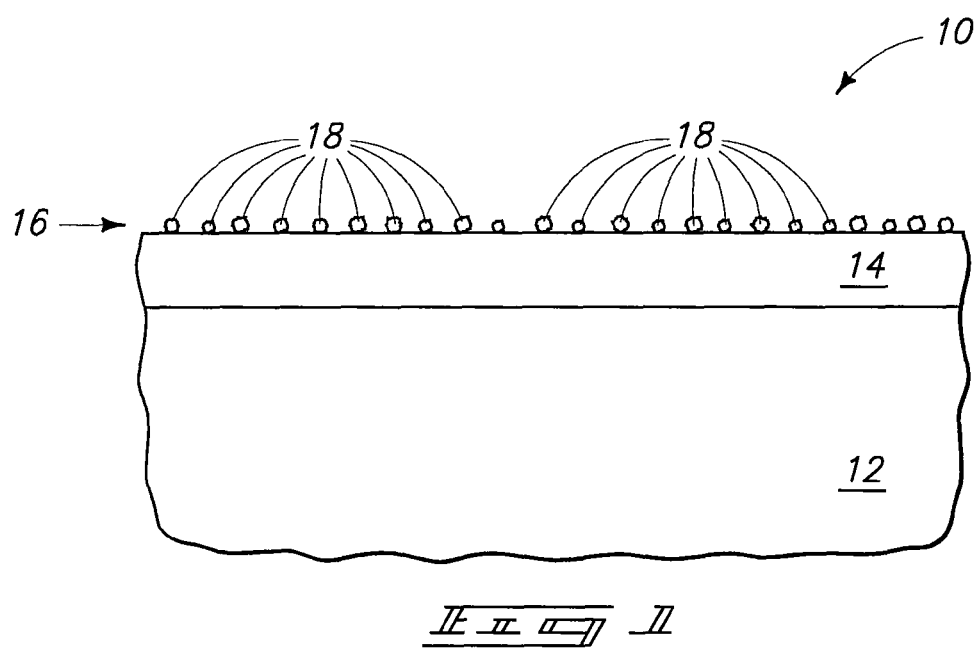
FIG. 1 is a diagrammatic sectional view of a portion of a substrate in process in accordance with an embodiment of the invention.

Some embodiments of the inventions are initially described with reference to FIGS. 1-4. Referring to FIG. 1, a semiconductor substrate is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 is an example only, and includes some base substrate 12 comprising a layer 14 formed thereover. Materials 12 and 14 might each encompass multiple different composition materials, regions, constructions, and/or layers, and accordingly might be homogenous or non-homogenous. In one embodiment, one or both of materials 12 and 14 comprises some suitable semiconductor material, and thereby substrate 10 comprises a semiconductor substrate. In one embodiment, material 12 might comprise monocrystalline silicon. In one embodiment, material 14 might comprise an oxide-comprising layer formed over substrate material 12. Example oxide-comprising materials 14 include doped or undoped silicon dioxide, as well as metal oxide(s) whether including one or multiple metals.

A layer 16 comprising nanodots 18 has been formed on oxide-comprising layer 14, and wherein nanodots 18 comprise a late transition metal. In the context of this document, "on" requires at least some direct physical touching contact between the two stated materials or layers. In one example embodiment, the late transition metal comprises platinum. Regardless, layer 16 might comprise, consist essentially of, or consist of nanodots 18 whether individually spaced and isolated from one another, or formed in clumps or grouped islands. By way of example only, a layer 16 comprising nanodots 18 consisting essentially of platinum can be deposited by plasma enhanced chemical vapor deposition at from about 10 mTorr to about 500 mTorr, from about 250° C. to about 400° C., using a grounded top electrode, a 100 W powered bottom electrode, methylcyclopentadienyl-trimethyl platinum with He as a carrier gas at about 50 sccm to about 100 sccm, and $O_2$ at about 100 sccm to about 500 sccm for from about 5 seconds to about 20 seconds.

Figure 2:
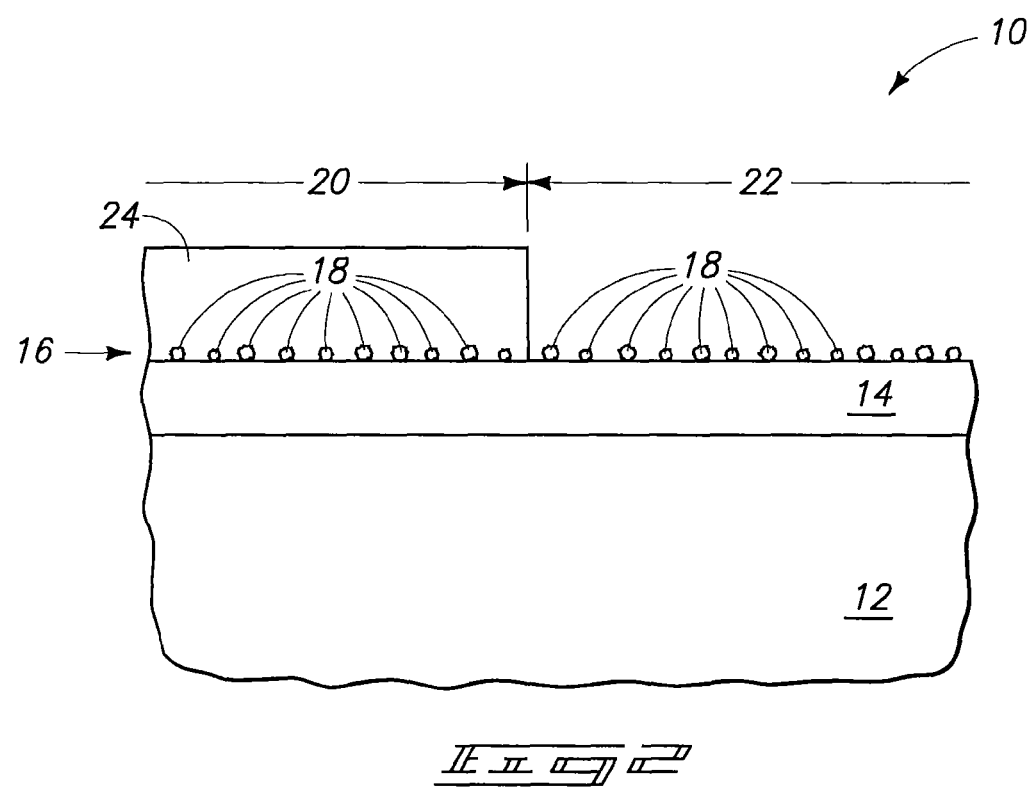
FIG. 2 is a view of the FIG. 1 substrate subsequent to that shown by FIG. 1.

Referring to FIG. 2, a portion 20 of nanodot-comprising layer 16 has been masked, for example using a mask 24, while another portion 22 of nanodot-comprising layer 16 is left outwardly exposed. The masking material 24 might comprise one or a combination of materials, for example, conductive, semiconductive, insulative, hard masking, photosensitive, combinations of these and other materials, etc., and may remain partially or wholly as part of the finished construction, or might be entirely removed in the finished construction. However, not all embodiments of the invention require any masking of a nanodot-comprising layer, and can be considered in one broad aspect as encompassing any method of etching nanodots comprising a late transition metal independent of any masking thereof during the etching.

Figure 3:
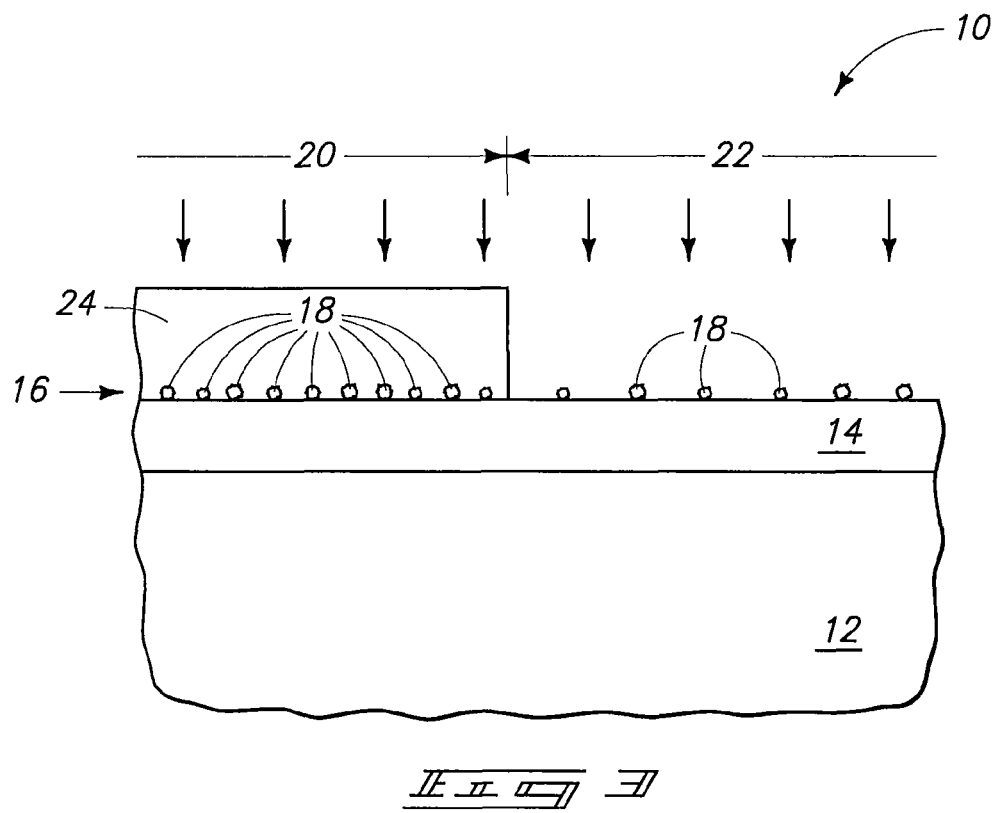
FIG. 3 is a view of the FIG. 1 substrate subsequent to that shown by FIG. 2.

Referring to FIG. 3, at least exposed portion 22 of nanodot-comprising layer 16 has been exposed to a gas comprising a phosphorous and halogen-containing compound and an oxidizing agent, for example as indicated by the downwardly directed arrows. In one embodiment, the phosphorous and halogen-containing compound and the oxidizing agent during the exposing comprise different compounds. In one embodiment, multiple phosphorous and halogen-containing compounds might be used and/or multiple oxidizing agents might be used. In one embodiment, the phosphorous and halogen-containing compound and the oxidizing agent during the exposing consist of different compounds, meaning no portion of the gas during the exposing comprises any phosphorous and halogen-containing compound which also acts as an oxidizer. Yet, one embodiment of the invention encompasses the phosphorous and halogen-containing compound and the oxygen agent during the exposing being comprised of a single compound, and further in another embodiment wherein the phosphorous and halogen-containing compound and the oxidizing agent during the exposing consist essentially of a single compound. By way of example only, such a single phosphorous and halogen-containing compound which also can act as a functional oxidizing agent comprises $POF_x$, where "x" is from 1 to 3. Further by way of example only, an example phosphorous and halogen-containing compound not inherently also functioning as an oxidizing agent is $PF_3$. Accordingly in one embodiment, the phosphorous and halogen-containing compound during the exposing comprises at least one of $PF_3$ and the above $POF_x$, and of course including a combination of $PF_3$ and $POF_x$. By way of example only, alternate or additional oxidants include at least one of $O_2$, $O_3$, NO, $NO_2$ and any suitable peroxide, for example, hydrogen peroxide. In one embodiment where the phosphorous and halogen-containing compound and the oxidizing agent during the exposing comprise at least two different compounds, an example volumetric ratio of all phosphorous and halogen-containing compound to all oxidizing agent compound during the exposing is from about 2:1 to about 4,000:1.

Fluorine is but one example halogen, as exemplified in the above $PF_3$ and/or $POF_x$ embodiments. However, any other halogen might also be utilized in any suitable phosphorous and halogen-containing compound.

Exposing of late transition metal-comprising nanodots to a gas comprising a phosphorous and halogen-containing compound and an oxidizing agent may or may not result in etching of late transition metal material or other material of the nanodots. Further in the event etching does occurs, such etching might only be effective to reduce size of one or more of the late transition metal-comprising nanodots. Alternately by way of example only, the exposing might completely etch some of the nanodots away from the substrate while leaving some nanodots remaining, and whether such remaining nanodots were not etched at all or only partially etched by the stated act of exposing. Regardless, some embodiments of the invention encompass exposure of late transition metal-comprising nanodots to a gas comprising a phosphorous and halogen-containing compound and an oxidizing agent wherein no discernable material of the nanodots is etched. FIG. 3 depicts one embodiment whereby the exposing of late transition metal-comprising nanodots 18 to a gas comprising a phosphorous and halogen-containing compound and an oxidizing agent has etched some of the nanodots completely away from the substrate.

While not wishing to be limited by any theory, the invention was motivated in addressing how to etch exposed late transition metal-comprising nanodots from a substrate essentially completely therefrom in a short amount of time and without damaging other material on the substrate during such etching action. It was determined that exposing late transition metal-comprising nanodots to a gas comprising a phosphorous and halogen-containing compound and an oxidizing agent took undesirably long to completely remove such nanodots from a substrate. Alternately, attempts were made to remove such nanodots by a wet etching technique utilizing an aqueous solution comprising HF, but again with unsatisfactory results either from a time and/or selectivity standpoint. However, it was discovered that exposing nanodots comprising a late transition metal to a gas comprising a phosphorous and halogen-containing compound and an oxidizing agent prior to exposure to an aqueous solution comprising HF may result in substantial removal of all late transition metal-comprising nanodots which were remaining by exposure to the HF-comprising aqueous solution, as is further explained below.

By way of example only, the gas during the exposing may include the phosphorous and halogen-containing compound and the oxidizing agent in vaporous form. The gas may comprise, consist essentially of, or consist of a phosphorous and halogen-containing compound and an oxidizing agent. The oxidizing agent may be selected depending on the presence or absence of additional material layers or other structures that may be exposed to the gas.

During the exposing, the gas may be introduced into a chamber that is configured to hold the substrate upon which the late transition metal-comprising nanodots are received. By way of non-limiting example, the chamber may be a CVD deposition chamber. The chamber may include a chuck for supporting and heating the substrate to a desired temperature and/or a shower head for dispensing the gas. By way of example only, the substrate temperature range in one embodiment is from about 320° C. to about 600° C. during the exposing. Further by way of example only, in one embodiment a suitable temperature range is from about 10 mTorr to about atmospheric pressure (about 760 Torr), with about 200 Torr being a specific example). For sake of example only, the chamber may be a deposition furnace, a CVD-type chamber, or an ALD-type chamber.

One or both of the phosphorous and halogen-containing compound and oxidizing agents may be continuously flowed or pulsed into the chamber. In one example, flow rate of $PF_3$ may range from about 100 standard cubic centimeters per minute (sccm) to about 20,000 sccm, and the flow rate of the oxidizing agent may range from about 5 sccm to about 500 sccm. In one embodiment, the flow rate of $PF_3$ gas is about 2,000 sccm and the flow rate of the oxidizing agent is about 100 sccm. For sake of example only, the exposure time may range from about 30 seconds to about 30 minutes. Other aspects as disclosed in our U.S. patent application Ser. No. 11/732,673 filed on Apr. 4, 2007, entitled Etchant Gas and Method for Removing Material From a Late Transition Metal Structure, naming Eugene P. Marsh as inventor, might also be utilized.

Figure 4:
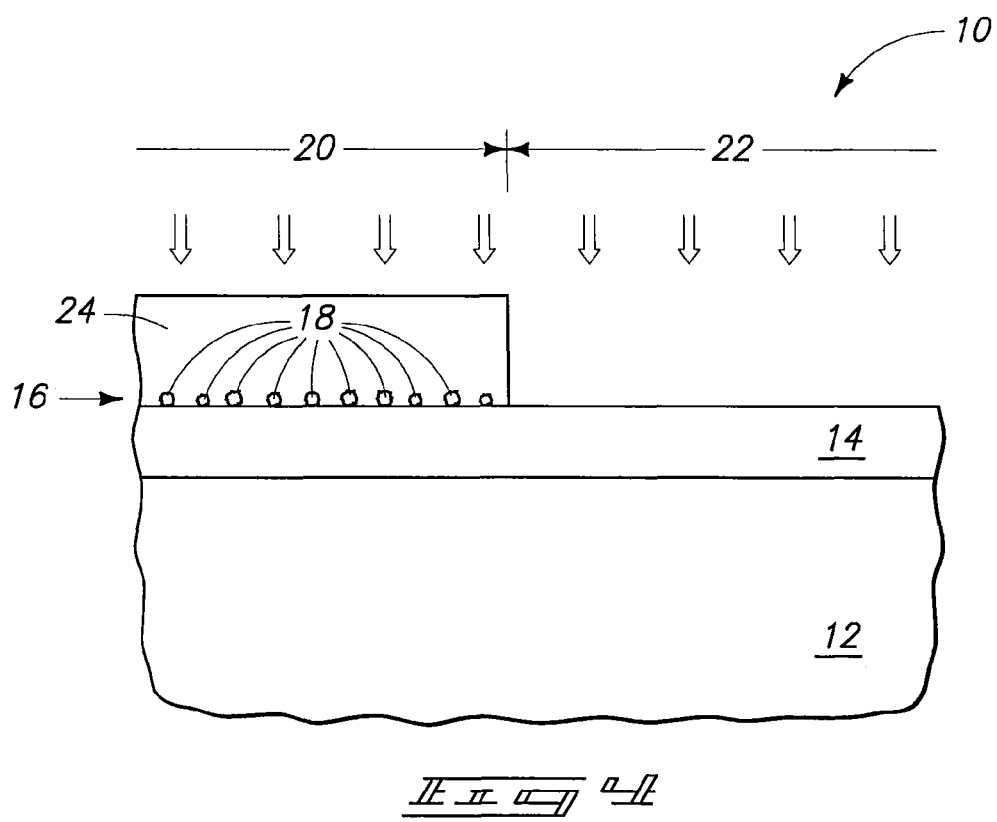
FIG. 4 is a view of the FIG. 1 substrate subsequent to that shown by FIG. 3.

Embodiments of the invention contemplate etching remaining of the nanodots that were exposed to the gas with an aqueous solution comprising HF. Such act of etching remaining of the nanodots might only remove material of one or more of the nanodots to reduce their size, might completely etch one or more of the nanodots away from the substrate, or such etching remaining of the nanodots might remove all those nanodots from the substrate that were left over the substrate after being exposed to the phosphorous and halogen-containing compound and an oxidizing agent during such initial exposing with the stated gas. FIG. 3 by way of example only, depicts an embodiment wherein the exposure to a gas comprising a phosphorous and halogen-containing compound and an oxidizing agent was effective to etch some of nanodots 18 of nanodot-comprising layer 16 completely from substrate 10. FIG. 4 depicts subsequent example processing wherein nanodots 18 remaining in portion 22 of FIG. 3 after the exposing have been etched with an aqueous solution comprising HF such that all such nanodots 18 within portion 22 have been completely removed from substrate 10.

In one embodiment, volumetric ratio of $H_2O$ to HF during the etching is from about 100:1 to about 600:1, with another example embodiment volumetric ratio of $H_2O$ to HF during the etching being at least about 300:1. In one embodiment, the aqueous solution comprising HF also comprises $NH_4F$ during the etching. In one embodiment, volumetric ratio of $H_2O$ to $NH_4F$ during the etching is from about 100:1 to about 600:1. By way of example only, etching with an aqueous solution comprising HF may be for a time period from about 5 seconds to about 5 minutes. In one embodiment, the etching comprises dipping the substrate into a liquid bath comprising the aqueous solution. Alternate conditions and techniques (i.e., spraying) might of course be used. In one embodiment, the etching with an aqueous solution comprising HF provides such solution (whether in bath or other form) at one or both of room temperature and room pressure. In one specific example embodiment, a QE2 solution (which contained 1% by weight $H_3PO_4$, 39% by weight $NH_4F$, 60% by weight water) at 220 parts by volume water to 1 part by volume QE2 was used to etch platinum nanodots after treatment thereof with $PF_3$ and $O_2$. Such solution also had HF in solution the result of $NH_4F$ presence. After a 30 second dip in such a bath at room temperature and pressure, all perceptible remaining platinum nanodots that had been previously exposed to the $PF_3$ and $O_2$ gas had been completely removed. Solutions other than QE2 would of course be usable.

In one embodiment, the etching of remaining nanodots received over an oxide-comprising layer is conducted selectively to the oxide-comprising layer. In the context of this document, conducting an etching "selectively" requires removal of the stated material relative to another material at a rate of at least 2:1. FIG. 4 depicts such an example selective etch. Dilute HF etching solution (i.e., at least 100:1 water to HF by volume) is ideally utilized in such instances to minimize oxide etching. In one embodiment, etching of remaining nanodots of the exposed portion in the FIG. 4 example embodiment has been conducted selectively relative to the oxide-comprising layer with a solution comprising $H_2O$, HF, and $NH_4F$, with the HF by volume relative to $H_2O$ being present in the solution at no greater than 1:100, and with the $NH_4F$ by volume relative to $H_2O$ being present in the solution at no greater than 1:100. Further in one embodiment, the solution used during the etching of remaining nanodots has the HF by volume relative to $H_2O$ being present in the solution at no less than 1:600, with the $NH_4F$ by volume relative to $H_2O$ also being present in the solution at no less than 1:600. In one embodiment, the etching of remaining nanodots is at a selectivity of nanodot removal to oxide-comprising layer removal of at least 10:1.

Figure 5:
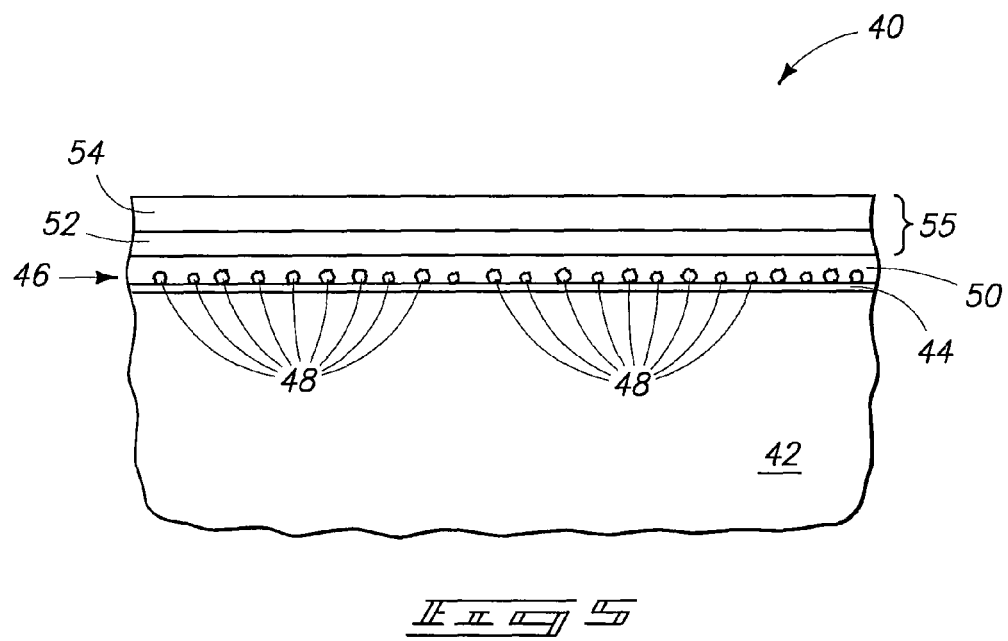
FIG. 5 is a diagrammatic sectional view of a portion of another substrate in process in accordance with an embodiment of the invention.

Embodiments of the invention include methods of fabricating one or more integrated circuit devices, for example, transistors, capacitors, diodes, rectifiers, memory cells, etc., and whether such devices are existing or yet-to-be developed. By way of example only, one embodiment method of forming a transistor gate construction is described with reference to FIGS. 5-9. Referring initially to FIG. 5, a substrate fragment is indicated generally with reference 40 and comprises a semiconductor material substrate region 42, for example monocrystalline silicon. Alternate substrates are of course contemplated. A first gate dielectric 44 has been formed over semiconductor substrate 42, with an example material being silicon dioxide thermally grown to an example thickness of from about 50 Angstroms to about 100 Angstroms.

A charge retaining layer 46 comprising nanodots 48 has been formed over first gate dielectric 44, wherein such nanodots comprise a late transition metal. An example thickness for layer 46 is from about 20 Angstroms to about 200 Angstroms, with from about 20 Angstroms to about 50 Angstroms being another example. In one embodiment, at least most of nanodots 48 are spaced from one another, and in one example spaced from one another by a distance about equal to their maximum cross dimension. A second gate dielectric 50 has been formed over nanodot-comprising layer 46, and is also shown as being received between spaced nanodots 48. By way of example only, one embodiment material includes hafnium aluminum oxide deposited to a thickness of from about 120 Angstroms to about 200 Angstroms. Conductive control gate material 55 has been formed over second gate dielectric 50. Such is depicted as comprising an inner conductive layer 52 and an outer conductive layer 54. By way of example only, one material 52 is $WSi_x$ deposited to a thickness range of from about 500 Angstroms to about 1,000 Angstroms, and an example conductive material 54 is W deposited to an example thickness range of from about 500 Angstroms to about 1,000 Angstroms.

Figure 6:
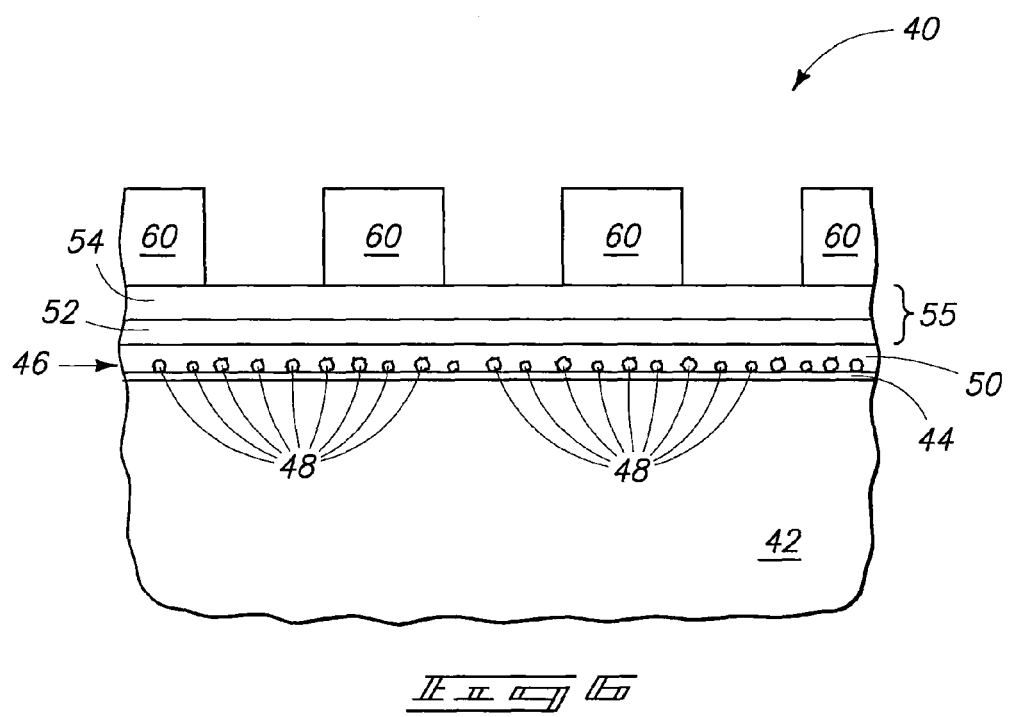
FIG. 6 is a view of the FIG. 5 substrate subsequent to that shown by FIG. 5.

Referring to FIG. 6, suitable masking 60 has been formed over conductive control gate material 55 into suitable gate line shapes. Such might include one or more of photosensitive materials, hard masking materials, etc.

Referring to FIG. 7, conductive control gate material 55 and second gate dielectric 50 have been etched effective to expose first gate dielectric 44 through nanodot-comprising charge retaining layer 46 at least in part using masking 60. Such provides but one example of masking a portion of a nanodot-comprising layer 46 while leaving another portion of such layer outwardly exposed. In this example embodiment, such masking comprises using conductive material, (i.e., material 55) which will become part of a transistor gate, at least in part for such masking.

Referring to FIG. 8, at least unmasked nanodots 48 of nanodot-comprising layer 46 have been exposed to a gas comprising a phosphorous and halogen-containing compound and an oxidizing agent. Any of the above example stated processings and techniques are of course contemplated.

Figure 9:
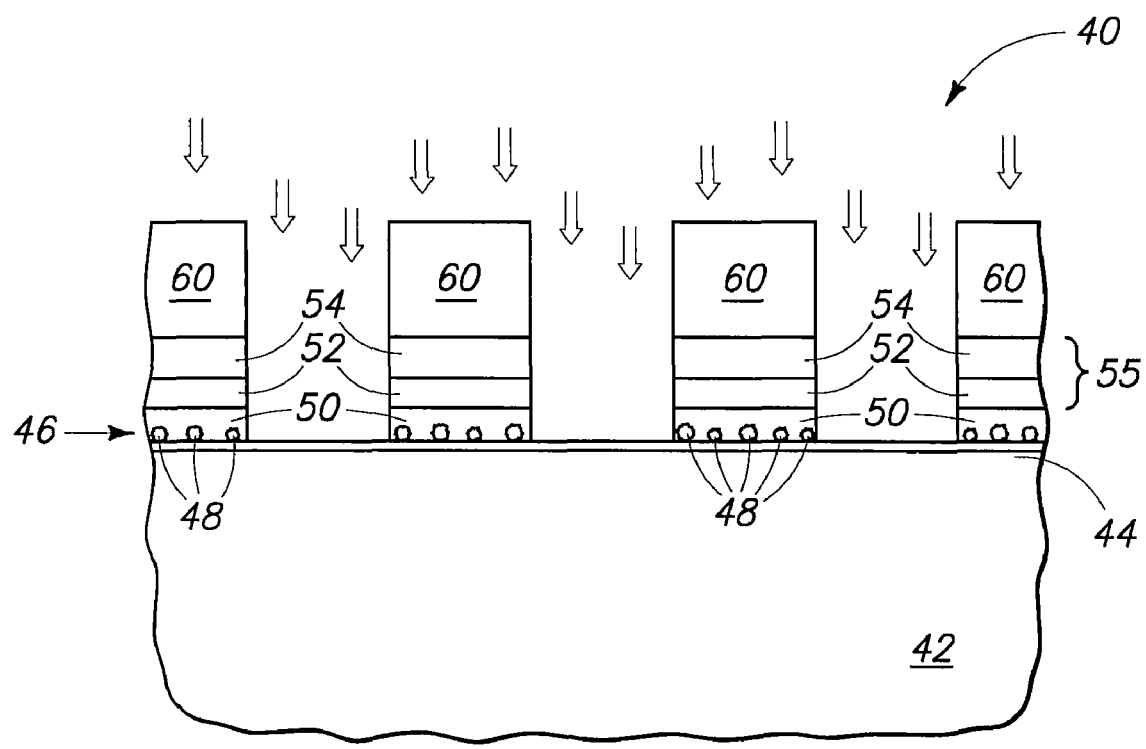
FIG. 9 is a view of the FIG. 5 substrate subsequent to that shown by FIG. 8.

Referring to FIG. 9, and after the FIG. 8 exposing, remaining of unmasked nanodots 48 have been etched with an aqueous solution comprising HF. Any of the above disclosed processings and techniques are of course contemplated. Accordingly by way of example only, such etching might remove all those nanodots from the substrate (as shown) that were left over the substrate after being exposed to the phosphorous and halogen-containing compound and oxidizing agent or leave some of such nanodots over the substrate (not shown).

The invention was initially contemplated in the context of etching nanodots comprising a late transition metal. However, aspects of the invention may be applicable to etching any layer comprising a late transition metal. For example, one embodiment of a method of etching a layer comprising a late transition metal includes exposing a layer comprising a late transition metal to a gas comprising a phosphorus and halogen-containing compound and an oxidizing agent effective to etch the layer, with the layer at least at the conclusion of the etch being discontinuously received over an underlying substrate. The layer prior to such exposing might be blanketly covering the underlying substrate (not shown), or might be discontinuous over the underlying substrate (i.e., as shown in FIG. 1 independent of whether layer comprises "nanodots"). After the exposing, the discontinuously received layer is etched with an aqueous solution comprising HF. All attributes as described above are of course contemplated. For example and further by way of example only, an embodiment includes a method of removing a layer comprising a late transition metal from a substrate wherein an oxide-comprising layer if formed over a substrate. A layer comprising a late transition metal is formed on the oxide-comprising layer. A portion of the late transition metal-comprising layer is masked while another portion of the late transition metal-comprising layer is left outwardly exposed. The exposed portion of the late transition metal-comprising layer is exposed to a gas comprising a phosphorus and halogen-containing compound and an oxidizing agent effective to etch only some of the outwardly exposed late transition metal-comprising layer completely from the substrate. After the exposing, remaining of the exposed portion of the late transition metal-comprising layer is etched selectively relative to the oxide-comprising layer with a solution comprising $H_2O$, HF, and $NH_4F$, with the HF by volume relative to $H_2O$ being present in the solution at no greater than 1:100, and the $NH_4F$ by volume relative to $H_2O$ being present in the solution at no greater than 1:100.

In compliance with the statute, the invention has been described in language more or less specific as to structural and methodical features. It is to be understood, however, that the invention is not limited to the specific features shown and described, since the means herein disclosed comprise example forms of putting the invention into effect. The invention is, therefore, claimed in any of its forms or modifications within the proper scope of the appended claims appropriately interpreted in accordance with the doctrine of equivalents.

The invention claimed is:

1. A method of forming a plurality of transistor gate constructions, comprising:

forming a first gate dielectric over a semiconductor substrate;

forming a charge retaining layer comprising nanodots over the first gate dielectric, the nanodots comprising a late transition metal;

forming second gate dielectric over the nanodot-comprising layer;

forming conductive control gate material over the second gate dielectric;

etching the conductive control gate material and the second gate dielectric to expose the first gate dielectric through the nanodot-comprising charge retaining layer and form a plurality of transistor gate constructions over the semiconductor substrate which respectively comprise the first gate dielectric, the charge retaining layer comprising nanodots, the second dielectric, and the conductive control gate material;

exposing nanodots of the nanodot-comprising layer that are received between the plurality of transistor gate constructions to a gas comprising a phosphorus and halogen-containing compound and an oxidizing agent; and after the exposing, etching remaining of the nanodots that are received between the plurality of transistor gate constructions with an aqueous solution comprising HF.

2. The method of claim 1 wherein the exposing etches away some of the nanodots received between the transistor gate constructions.

3. The method of claim 1 wherein the etching removes all of the remaining nanodots from being received between the transistor gate constructions.

4. The method of claim 1 wherein,
the exposing etches away some of the nanodots received between the transistor gate constructions; and
the etching removes all of the remaining nanodots from being received between the transistor gate constructions.

5. A method of fabricating an integrated circuit device, comprising:
providing a layer comprising nanodots over a semiconductor substrate, the nanodots comprising a late transition metal;
masking a portion of the layer while leaving another portion of the layer outwardly exposed;
exposing the exposed portion of the nanodot-comprising layer to a gas comprising a phosphorus and halogen-containing compound and an oxidizing agent;
after the exposing, etching remaining nanodots of the exposed portion with an aqueous solution comprising HF; and
after the etching, incorporating a remaining of the portion of the layer which was masked during the exposing into an integrated circuit device comprising at least one of a capacitor, diode, rectifier, and memory cell.

6. The method of claim 5 wherein the incorporating comprises forming the integrated circuit device to comprise a capacitor.

7. The method of claim 5 wherein the incorporating comprises forming the integrated circuit device to comprise a diode.

8. The method of claim 5 wherein the incorporating comprises forming the integrated circuit device to comprise a rectifier.

9. The method of claim 5 wherein the incorporating comprises forming the integrated circuit device to comprise a memory cell.

10. The method of claim 5 wherein the exposing is of nanodots wherein the late transition metal comprises at least one of Pt, Rh, Ir, Pd, Cu, Co, Fe, Ni, Ag, Os, Au, Ru and alloys thereof.

11. The method of claim 10 wherein the exposing is of nanodots comprising Pt.

12. A method of forming integrated circuit device structures, comprising:
forming nanodots over a semiconductor substrate, the nanodots comprising a late transition metal;
forming conductive material over the nanodots;
patterning the conductive material to form a pair of spaced adjacent integrated circuit device structures comprising the conductive material and the nanodots, the nanodots being received between the adjacent device structures;
exposing the nanodots received between the adjacent device structures to a gas comprising a phosphorus and halogen-containing compound and an oxidizing agent; and
after the exposing, etching remaining nanodots received between the adjacent integrated circuit device structures with an aqueous solution comprising HF.

13. The method of claim 12 comprising forming dielectric material over the nanodots prior to forming the conductive material.

14. The method of claim 13 wherein the dielectric material is formed on the nanodots and the conductive material is formed on the dielectric material.

15. The method of claim 12 wherein the exposing etches away some of the nanodots received between the integrated device structures.

16. The method of claim 12 wherein the etching removes all of the remaining nanodots from being received between the integrated device structures.

17. The method of claim 12 wherein,
the exposing etches away some of the nanodots received between the integrated device structures; and
the etching removes all of the remaining nanodots from being received between the integrated device structures.

18. The method of claim 12 wherein the integrated device structures comprise transistor gate constructions.

19. The method of claim 18 wherein the transistor gate constructions respectively comprise a control gate region and a charge trapping region.

* * * * *